(12) United States Patent
Vissenberg et al.

(10) Patent No.: US 11,906,118 B2
(45) Date of Patent: Feb. 20, 2024

(54) FOLDABLE LIGHT GENERATING DEVICE

(71) Applicant: SIGNIFY HOLDING B.V., Eindhoven (NL)

(72) Inventors: Michel Cornelis Josephus Marie Vissenberg, Roermond (NL); Marcellinus Petrus Carolus Michael Krijn, Eindhoven (NL); Bartel Marinus Van De Sluis, Eindhoven (NL); Leendert Teunis Rozendaal, Valkenswaard (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/030,551

(22) PCT Filed: Oct. 14, 2021

(86) PCT No.: PCT/EP2021/078440
§ 371 (c)(1),
(2) Date: Apr. 6, 2023

(87) PCT Pub. No.: WO2022/079163
PCT Pub. Date: Apr. 21, 2022

(65) Prior Publication Data
US 2023/0375144 A1    Nov. 23, 2023

(30) Foreign Application Priority Data
Oct. 15, 2020    (EP) .................................... 20202109

(51) Int. Cl.
*F21S 4/24*    (2016.01)
*H05K 1/02*    (2006.01)
(Continued)

(52) U.S. Cl.
CPC ................. *F21S 4/24* (2016.01); *H05K 1/028* (2013.01); *F21Y 2103/10* (2016.08); *F21Y 2115/10* (2016.08); *H05K 2201/10106* (2013.01)

(58) Field of Classification Search
CPC . F21S 4/22; F21S 4/24; F21Y 2103/10; F21Y 2103/20; H05K 1/028
See application file for complete search history.

(56) References Cited

U.S. PATENT DOCUMENTS 9,146,017 B2    9/2015  Van Der Wel et al.
10,520,144 B1*  12/2019  Tanguileg .............. H05K 1/181
(Continued)

FOREIGN PATENT DOCUMENTS

DE    102009023052 A1    12/2010
DE    102016221130 A1     4/2018
(Continued)

*Primary Examiner* — Robert J May

(57) ABSTRACT

The invention provides a light generating device (1000) comprising s1 light sources (100) and a support (200) configured to support the s1 light sources (100), wherein the s1 light sources (100) are configured to generate light source light (101), wherein s1>1 and wherein: (a) the support (200) comprises n1 domains (210), wherein n1>3, wherein the support (200) comprises k1 fold lines (220), wherein k1>2, wherein at least three of the n1 domains (210) are separated by at least two of the k1 fold lines (220); wherein the domains (210) have a first domain side (211) and a second domain side (212); (b) the at least three of the n1 domains (210) and the at least two of the k1 fold lines (220) are configured parallel; and (c) the light generating device (1000) comprises m1 adhesive layers (400), wherein m1>2; and wherein at least two of the m1 adhesive layers (400) are functionally coupled to different domain sides (211,212) of one or more domains (210).

15 Claims, 8 Drawing Sheets

(51) Int. Cl.
   *F21Y 103/10*     (2016.01)
   *F21Y 115/10*     (2016.01)

(56) References Cited

U.S. PATENT DOCUMENTS

| | | |
|---|---|---|
| 2009/0261368 A1 | 10/2009 | Wang et al. |
| 2013/0163238 A1 | 6/2013 | Wang et al. |
| 2014/0369038 A1 | 12/2014 | Tischler et al. |
| 2015/0069431 A1 | 3/2015 | Oraw et al. |
| 2015/0117001 A1 | 4/2015 | Fan |
| 2015/0131289 A1 | 5/2015 | Speer et al. |
| 2015/0292707 A1 | 10/2015 | Dingemans et al. |
| 2016/0025311 A1 | 1/2016 | Tischler |
| 2016/0327223 A1 | 11/2016 | Venk et al. |

FOREIGN PATENT DOCUMENTS

| | | |
|---|---|---|
| EP | 3217068 A1 | 9/2017 |
| WO | 2014155233 A1 | 10/2014 |

* cited by examiner

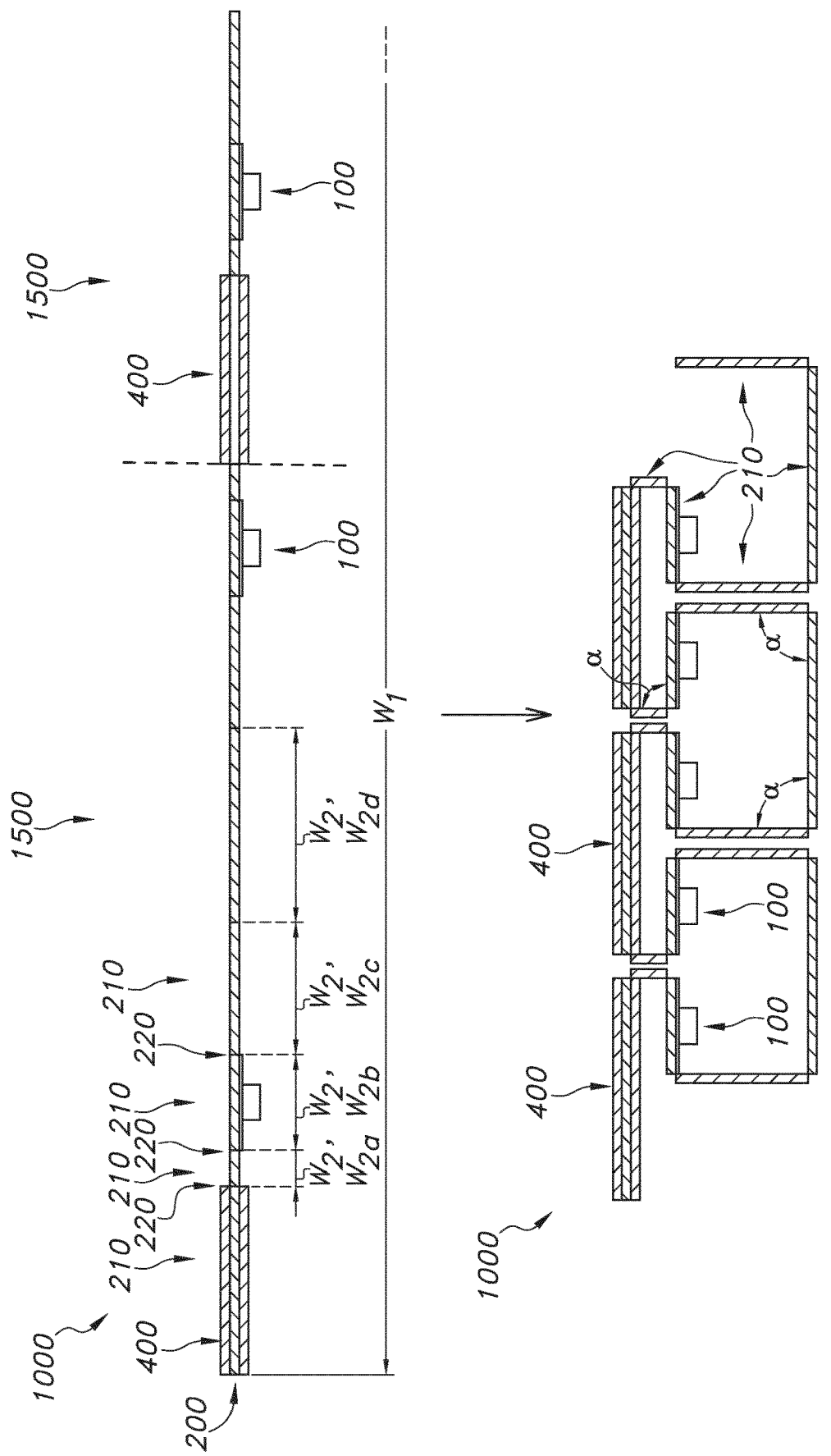

FOLDABLE LIGHT GENERATING DEVICE

CROSS-REFERENCE TO PRIOR APPLICATIONS

This application is the U.S. National Phase application under 35 U.S.C. § 371 of International Application No. PCT/EP2021/078440, filed on Oct. 14, 2021, which claims the benefit of European Patent Application No. 20202109.3, filed on Oct. 15, 2020. These applications are hereby incorporated by reference herein.

FIELD OF THE INVENTION

The invention relates to a light generating device.

BACKGROUND OF THE INVENTION

Illumination strips are known in the art. For instance, US2013163238A1 describes an indoor illuminator for adjusting lighting field includes a casing, two adjusting portions and two illuminating strips. The casing has a top plate and two side plates. Each adjusting portion includes a bottom plate and a base plate. The base plate is mounted on the bottom plate. The two illuminating strips are respectively and correspondingly disposed on the two adjusting portions. Each illuminating strip includes an elongated loading plate and an elongated positioning plate. The loading plate has multiple light emitting diodes mounted on the loading plate. The positioning plate is respectively connected with the loading plate and the base plate of a corresponding adjusting portion to be enclosed as a triangular tube. The loading plate is pivotable relative to the base plate such that a projecting angle of the loading plate is adjustable and the lighting field is adjustable.

SUMMARY OF THE INVENTION

Flexible light strips and sheets may offer ease of installation and conform to many desired shapes. They can for instance be used in various applications such as in accent lighting, task lighting, or serve as a decorative lighting solution. They may be stored and transported compactly on a roll, and laid out along a long straight line on site, and possibly cut to size. However, additional measures may be required to achieve desired mechanical and optical properties.

In particular, flexible light strips may be employed with additional extruded profiles for mechanical and/or optical functionality (keep the strip straight, hide the LEDs from direct view, shape the beam, etc.). Further, while the light strip may be flexible and stored on a compact roll, the profiles are usually long and inconvenient to transport. LED strips can typically be cut to length, yet, the profiles have predefined lengths, meaning one has to cut one profile to the correct length (inconvenience, waste) and/or to combine a few profiles for the wanted length (visible joint between the profiles).

Similarly, flexible light sheets may be employed with an additional rigid structure (or: "box") (with a well-defined distance to the diffusive exit) to turn into uniform 2D light sources. While the LED sheet may be flexible and stored on a compact roll, the optical boxes may have predefined sizes and may be inconvenient to transport. Light sheets can typically be cut to size, yet, as the boxes have predefined sizes, meaning one has to cut it to the correct size (inconvenience, waste) and/or to combine a few boxes for the wanted length (visible joint between the boxes).

Further, light strips and sheets may have fixed appearance and light emission patterns, thereby limiting the freedom of lighting design and limiting the possibilities to avoid issues such as glare. Further, light strips and sheets may lack rigidity: during installation, they may require mechanical support at relatively many points along the strip/sheet.

Hence, it is an aspect of the invention to provide an alternative foldable light generating device, which preferably further at least partly obviates one or more of above-described drawbacks. The present invention may have as object to overcome or ameliorate at least one of the disadvantages of the prior art, or to provide a useful alternative.

Hence, in a first aspect, the invention may provide a light generating device. The light generating device may comprise s1 light sources, especially wherein $s1 \geq 1$. The light generating device may further comprise a support configured to support the s1 light sources. The s1 light sources may be configured to generate light source light. In embodiments, the support may comprise n1 domains, such as $n1 \geq 2$, especially wherein $n1 \geq 3$. The domains may have a first domain side and a second domain side, Further, the support may comprise k1 fold lines, such as $k1 \geq 1$, especially wherein $k1 \geq 2$. In further embodiments, at least three of the n1 domains may be separated by at least two of the k1 fold lines. The at least three of the n1 domains and the at least two of the k1 fold lines may be configured parallel to each other. In further embodiments, the light generating device may comprise m1 adhesive layers, such as $m1 \geq 1$, especially wherein $m1 \geq 2$. Especially, at least two of the m1 adhesive layers may be functionally coupled to different domain sides of one or more domains. This comprises that at least one domain has an adhesive layer functionally coupled to its first side and its second side, and/or an adhesive layer is functionally coupled to a first domain side of at least one domain and an adhesive layer is functionally coupled to a second domain side of at least one different domain, i.e. at least one adhesive layer is provided on the first domain side and at least one adhesive layer is provided on the second domain side, which can be the first domain side and the second domain side of the same domain, but it can also be the first domain side and the second domain side of different domains.

Thereby, the invention may provide the benefit that the light generating device is easy to install and transport, while the desired mechanical and optical features may be inherently provided. In particular, the invention may in embodiments provide a flexible light strip/sheet with a support with clear/diffuse/reflective/absorbing areas that can be folded around/aside the light strip/sheet to create mechanical stability and an optical function (block direct view, beam shaping, et cetera). This may provide the benefit that the flexible light strip/sheet, the mechanical profile/structure and the optical element can be combined in a single flexible element that can be stored on a roll and can be cut to the desired length with limited, especially no, waste generation. The support can be adjusted on site to the application to create mechanical stiffness and appropriate light directions. Further, the invention provides the possibility to late stage configurational changes. The invention provides, amongst others, embodiments wherein the light generating device is not (yet) folded and embodiments wherein the light generating device is folded. The adhesives may facilitate fixating the light generating device in the appropriate shape and/or to attach the system to a wall or ceiling. In particular, the light generating device (on roll) may provide flexibility with regards to the arrangements in which it can be employed, i.e., there may be a one-to-one mapping between a layout structure of the light generating device and the shape of a luminaire, but the light generating device may further facilitate variations in the final shape and/or attachment location. In particular, the one or more domains may facilitate customizable beam shaping. This may enhance design freedom while maintaining ease of installation. Similarly, The domains may be arranged to customize and/or define the beam shape and to reduce glare as they may serve as adjustable beam delimiters. The feature that at least one adhesive layer is on the first domain side and at least one adhesive layer is provided on the second domain side renders the light generating device to have the advantage that when in a mounted configuration at least one domain is folded atop another domain, said atop layers can be mutually fixed by the adhesive layer as provided on one domain side, and yet the mounted configuration can be fixed by the adhesive layer as provided on the other, opposite domain side. Also easy mounting is enabled of the light generating device in a corner of a room between wall and ceiling. The adhesive layer can be provided on the first and second domain side of the same domain, and/or different domains.

In specific embodiments, the invention may provide a light generating device comprising s1 light sources and a support configured to support the s1 light sources, wherein the s1 light sources are configured to generate light source light, wherein s1≥1; and wherein the support comprises n1 domains, wherein n1≥3, wherein the support comprises k1 fold lines, wherein k1≥2, wherein at least three of the n1 domains are separated by at least two of the k1 fold lines; wherein the domains have a first domain side and a second domain side; the at least three of the n1 domains and the at least two of the k1 fold lines are configured parallel; and the light generating device comprises m1 adhesive layers, wherein m1≥2; and wherein at least two of the m1 adhesive layers are functionally coupled to one or more of (i) different domain sides of one or more domains, and (ii) different domains.

Hence, the light generating device of the invention may be rolled up into a compact reel (for ease of shipping), may be installed easily, during which domains may be folded to hide the light sources, to provide desired optical properties (such as glare reduction and beam delimitation), and to provide desired mechanical properties, such as a rigid structure.

The invention may thus provide a light generating device. The light generating device may comprise s1 light sources, which may be configured to provide, especially generate, light source light. In further embodiments, the s1 light sources may comprise solid state light sources, especially solid state light sources (such as LEDs or laser diodes). The term "LED" may also refer to a plurality of LEDs.

The term "light source" may in principle relate to any light source known in the art. In a specific embodiment, the light source comprises a solid state LED light source (such as a LED or laser diode). In embodiments, the light source comprises an OLED. In yet other embodiments, the light source comprises an electroluminescent device.

The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

In embodiments, the light source may be configured to provide primary radiation, which is used as such, such as e.g. a blue light source, like a blue LED, or a green light source, such as a green LED, and a red light source, such as a red LED.

In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as a LED with a luminescent material layer or dome comprising luminescent material. In other embodiments, the luminescent material may be configured at some distance ("remote") from the light source, such as a LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be used by the luminescent material.

The light generating device may comprise a single (elongated) filament LED or single OLED, or electroluminescent or other elongated light emitting device.

Alternatively or additionally, the light generating device may comprise a plurality of light sources, i.e. s1≥1. When a plurality of light sources is applied, they may all be of the same type, like LEDs. In alternative embodiments, different types of light sources may be applied like LEDs and OLEDs. Note that different LEDs may provide the same spectral power distributions (such as from the same bin) or different spectral power distributions (see also below), like different colors.

The light generating device may further comprise a support, especially a support configured to support the s1 light sources. The support may especially comprise one or more of an optical foil and a substrate. The substrate may be configured to support the s1 light sources.

As known in the art, a printed circuit board ("PCB" or "board") may mechanically support and electrically connect electronic components or electrical components using conductive tracks, pads and other features etched from one or more sheet layers of copper laminated onto and/or between sheet layers of a non-conductive substrate (shortly indicated as "track" or "conductive track"). Especially, herein the PCB is a flexible PCB, see also below.

Hence, in embodiments a PCB may comprise an insulating layer arranged between a substrate and a conductive layer.

An (electronic) component, such as a solid stage light source, may generally be soldered onto the PCB to both electrically connect and mechanically fasten it to the PCB. For instance, a basic PCB may consist of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for EM shielding or other purposes. The tracks function as wires fixed in place, and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist.

In embodiments, the support may comprise the PCB. In embodiments, the support comprises a plurality of PCBs. In embodiments, the support may have a length and the one or more PCBs may essentially have the same length, like at least 90% of the length of the support. In embodiments, the support has a width larger than a width of the PCB(s). In embodiments, the support may extend at both sides of the PCB(s).

In alternative embodiments, the PCB may be support by the support. For instance, the support may comprise a foil, configured to support the PCB. In embodiments, the PCB may be laminated to the foil. Especially, in embodiments the PCB may be flexible.

Hence, the shape of the support may in general be plate-like. Especially, in embodiments the support may have a length and a width and a height, wherein an aspect ratio of the length and the height is at least 5, like in the range of 5-5000, like 10-2500, and wherein an aspect ratio of the width and the height is at least 2, such as an aspect ratio of at least 5, like in the range of 5-5000, like 10-2500. The terms "length", "width", and "height" may also refer to "largest length", "largest width", and "largest height", respectively. The support, such as a PCB, may especially have a rectangular cross-section (such as a square cross-section).

The height (or thickness) of the support may in embodiments be selected from the range of 0.1-10 mm, such as 0.5-5 mm, like 1-2 mm. In specific embodiments, the thickness of the support may be in the range of 0.1-10 mm, especially 0.2-0.5 mm. The width of the support may in embodiments be selected from the range of 5-200 mm, such as 5-50 mm.

The length of a single printed circuit board area may in embodiments e.g. be selected from the range of 10-50 mm, such as 15-40 mm. In other embodiments, the PCB(s) may essentially have the same length as the support. The length of the support, including a plurality of (connected) PCB areas (which may at least be partly comprised by the support or which may be configured on the support, may in embodiments e.g. be selected from the range of 20-2000 mm, such as 20-1500 mm. Other dimensions may be possible as well. Hence, in specific embodiments the PCB(s) may essentially have the same length as the support, such as in embodiments a length selected from the range of 20-2000 mm. However, other dimensions may be possible as well.

In further embodiments, the functional component may comprise an electronic component, especially an electronic component selected from the group comprising a solid state light source, a driver, an electronic module, or a sensor. Especially, the electronic component may comprise a solid state light source.

In specific embodiments, the printed circuit may be flexible. In yet other embodiments, the printed circuit board may be rigid.

In embodiments, the board may comprise a metal, especially a metal selected from the group comprising copper aluminum, tin, iron, silver and lead, more especially a metal selected from the group comprising copper and aluminum.

In further embodiments, the (printed circuit) board may have a thermal conductivity of at least 0.5 W/(m*K), such as at least 1 W/(m*K). In yet further specific embodiments, the (printed circuit) board may have a thermal conductivity of at least 10 W/(m*K), such as at least about 20 W/(m*K). Even more especially in embodiments the (printed circuit) board may have a thermal conductivity of at least 200 W/(m*K), especially at least 250 W/(m*K), such as at least 300 W/(m*K).

The support may be flexible. In such instance, when the support comprises a PCB, the PCB may also flexible. In other embodiments, one or more domains may be rigid, but may nevertheless be folded due to the fold lines. In embodiments, one or more (flexible) PCBs may be partly comprised by the support or may be configured on the support. In embodiments, one or more PCBs may be functionally coupled to the support. Especially, the support is a flexible support.

Especially, the s1 light sources may be functionally coupled to the PCB. Hence, the s1 light sources may be powered and/or controlled via the PCB.

Therefore, in specific embodiments, the support may comprise (at least partly) a PCB or a PCB may be functionally coupled to the support. Especially, the s1 light sources may be functionally coupled to the PCB. Further, in embodiments the s1 light sources comprise solid state light sources. Especially, the support is flexible. Further, especially the PCB is flexible.

The support may comprise n1 domains. In embodiments, n1 is at least 2. Even more especially, $n1 \geq 3$. In particular, the support may be divided into n1 domains. The n1 domains may especially be non-overlapping. In embodiments, the support may have a length, a width and a thickness, wherein the support is divided into domains along the length and width, i.e., the domains may essentially be arranged in 2D.

The support may further comprise k1 fold lines, especially wherein $k1 \geq 2$. Each fold line may facilitate folding of the support at the (respective) fold line. In general, the fold lines may be configured in parallel to the length or width of the support, especially to the length of the support. However, the fold lines may essentially be arranged in any direction, such as at an angle to the length and width of the support.

The fold lines may especially define the domains. In particular, the fold lines may delineate the edges of the domains. Hence, a domain may be defined by the adjacent fold lines and/or edges of the support.

In embodiments, at least two of the n1 domains may be separated by at least one of the k1 fold lines. Even more especially, in embodiments at least three of the n1 domains may be separated by at least two of the k1 fold lines, especially wherein the at least three of the n1 domains and the at least two of the k1 fold lines are configured parallel. In such embodiments, the at least three of the n1 domains may especially be elongated along the domain length, which may especially be parallel to the support length, wherein the domain length is parallel to the at least two of the k1 fold lines. In further embodiments, the at least three of the n1 domains may have a rectangular shape, wherein the at least two of the k1 fold lines are parallel to a side of the rectangular shape of the at least three of the n1 domains.

Phrases like "at least three of the n1 domains may be separated by at least two of the k1 fold lines", and similar phrases, or phrases like "the at least three of the n1 domains and the at least two of the k1 fold lines are configured parallel", and similar phrases suggest a number of domains, especially in embodiments configured with fold lines parallel to a length of the support. However, it is not excluded that there are more domains. Further, fold lines perpendicular to those fold lines are also not excluded. Especially, however at least n+1 of the n1 domains and the at least n of the k1 fold lines are configured parallel, and are configured parallel to a length of the support.

In embodiments, the domains may have a first domain side and a second domain side, wherein the first domain side and the second domain side may define a support thickness H1. In particular, the support may have a first support side and a second support side, wherein the domains, especially all of the domains, have a first domain side at the first support side and a second domain side at the second support side. Especially, the height or thickness of the support may be defined perpendicular to the length of the support. The first domain side and the second domain side may thus be configured opposite of each other. The first domain side and the second domain side may essentially parallel to each other. Between the first domain side and the second domain side may in embodiments be polymeric material, such as one or more selected from the group comprising polyimide (PI), polyethylene terephthalate (PET), polyethylene naphthalate (PEN), and aramid. Instead of PET or PEN, also other polyesters may be applied.

In embodiments, the support may comprise an optical foil. In such embodiments, the support may comprise support material comprising one or more of polymethyl methacrylate (PMMA) or polycarbonate (PC). Alternatively or additionally, the support material comprising one or more of PET, polyethylene (PE), polyurethane (PU), and polypropylene (PP).

On one side (or on both sides) of the support, one or more PCBs may be configured and/or electrically conductive tracks. Further layers may be available on one or both sides of the support, or may be comprised by the support. Especially, the support may consist of one or more of a PI foil, a PET foil, a PEN foil, and an aramid foil. Alternatively or additionally, the support material may consist of one or more of PET, polyethylene (PE), polyurethane (PU), and polypropylene (PP).

In embodiments, the support may be transmissive for the light source light. In embodiments, the support may be transparent for the light source light. In embodiments the support may be translucent for the light source light. In embodiments the support may be reflective for the light source light. In embodiments the support may be light absorbing for the light source light. In embodiments, the support may be one or more of light transmissive, light reflective, and light absorbing.

In embodiments, at least part of a domain, or an entire domain, may be absorbing, in even more specific embodiments even essentially black. Hence, substantially all light source light that irradiates such part of a domain, or an entire domain, is absorbed. In such embodiments, another part of the domain or another domain, maybe transmissive for light. However, light source light may in embodiments of course also escape via other routes, such as an opening between domains.

In general, the thickness of the domains may (locally) equal the support thickness H1. In embodiments, the support may have the same support thickness H1 for at least 60% of the area defined by the support length and the support width, such as at least 70%, especially at least 80%, such as at least 90%, especially at least 95%, including 100%.

In further embodiments, the (average) support thickness H1 may be selected from the range of 0.1-10 mm, such as 0.2-0.5 mm.

In embodiments, the fold lines may comprise a groove, especially wherein the groove is configured to facilitate folding. The groove may especially have a V-shape. In embodiments, the groove may have a groove depth d1, especially wherein $0.1*H1 \leq d1 \leq 0.9*H1$. Alternatively or additionally to grooves, fold lines may include perforations. Alternatively or additionally to grooves and/or perforation lines, the fold line may also be defined by a difference in thickness or a difference in stiffness between two adjacent domains. For instance, one or more domains of the support may comprise a laminate with more layers than one or more other domains. Also in this way folding may be facilitated. When of a plurality of fold lines at least two fold lines are provided with a respective groove, at least one fold may be provided with a groove only on the first domain side and at least one further fold may be provided with a further groove only on the second domain side. Thus, folding of domains in opposite directions may be further facilitated. Alternatively, at least one fold may be provided with grooves on both the first and second domain side. Said folding in opposite directions relate to a forward or valley fold at the fold with the groove on the first domain side, and a backward or mountain fold at the fold with the groove on the second domain side, as seen in relation to the first domain side on which the light sources are configured.

In embodiments, the light generating device may comprise m1 adhesive layers. In embodiments m1 is at least 1, even more especially m1≥2. The m1 adhesive layers may be functionally coupled to a first domain side or a second domain side of a domain, which may facilitate adhering the domain side of the domain to a further element. The further element may be a different domain (side) of the light generating device, a different light generating device, or, for example, a wall or a ceiling. When an adhesive layer if functionally coupled to a domain side, the adhesive layer may in embodiments be functionally coupled to at least 50% of an area of the domain side, such as at least 70%, like at least 80%. The term "adhesive layer" may also refer to plurality of adhesive layers. Hence, one or more adhesive layers may be configured adjacent to each other on the same domain side. As indicated above, especially two domains and/or two domain sides may comprise an adhesive layer.

In particular, at least two of the m1 adhesive layers may be functionally coupled to one or more different domain sides of one or more domains, especially to the first domain side and the second domain side of one domain of the n1 domains. Especially, the one domain may be functionally coupled to adhesive layers on opposite sides, i.e., two adhesive layers may be arranged (at least partially) opposite of each other (at the same domain); the two adhesive layers may overlap when superimposed along the support height. In further embodiments, one or more domains of the n1 domains may (each) be functionally coupled to adhesive layers on the first domain side and on the second domain side, especially wherein the adhesive layers on the first domain side and on the second domain side are arranged (at least partially) opposite of each other. Hence, in embodiments, the light generating device may comprise at least one domain with one of the m1 adhesive layers functionally coupled to the first domain side and with another one of the m1 adhesive layers functionally coupled to the second domain side.

In further embodiments, alternative or additional to the afore-mentioned embodiments, at least two of the m1 adhesive layers may be functionally coupled to different domains, especially at the same domain side of the different domains, such as at the first domain sides of two or more different domains, or such as at the second domain sides of two or more different domains.

In general, prior to folding, each adhesive layer may be functionally coupled to a single (domain side of a single) domain.

In embodiments, the support may be bendable, especially flexible. In embodiments, the support may comprise a flexible foil, especially a flexible optical foil. In embodiments, the support may be provided as roll and may be unrolled, especially essentially without loss of functionality.

In further embodiments, one or more, especially all of, the n1 domains may each individually be one or more of opaque, (partially) reflective, especially diffusely reflective, or specularly reflective, and semi-transparent.

In further embodiments, at least one of the n1 domains is transmissive, especially transparent, or especially translucent, for the light source light.

Alternatively or additionally, in further embodiments, at least one of the n1 domains is reflective for the light source light. In particular, in embodiments, the first domain side of at least one of the n1 domains may be reflective for the light source light. In further embodiments, the second domain side of at least one of the n1 domains may be reflective for the light source light.

In embodiments, in general, the s1 light sources may especially be (all) arranged at the first support side or (all) at the second support side, especially (all) at the first support side. However, in further embodiments, at least part of the s1 light sources may be arranged at the first support side and at least part of the s1 light sources may be arranged at the second support side.

Hence, in embodiments, $s1 \geq 2$, such as $a \geq 4$, especially $\geq 10$, such as $\geq 20$, especially $\geq 100$, such as even $\geq 100$. In further embodiments, $s1 \leq 100,000$, such as $\leq 50,000$, especially $\leq 10,000$. For instance, a $1 \times 1$ m$^2$ support may e.g. in the range of 200-20,000 light sources, such as LEDs, at a support side.

The light sources are configured to generate light. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light. The term UV radiation may in specific embodiments refer to near UV radiation (NUV). Therefore, herein also the term "(N) UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR. Herein, the term "visible light" especially relates to light having a wavelength selected from the range of 380-780 nm. Especially, one or more of the light sources may be configured to generate white light.

In embodiments, one or more, especially all light sources, may be controlled by a control system. For instance, in this way the light source light of the light sources may be controlled in one or more of intensity and spectral power distribution.

In specific embodiments, the light generating device may comprise a plurality of different light sources, such as two or more subsets of light sources, with each subset comprising one or more light sources configured to generate light source light having essentially the same spectral power distribution, but wherein light sources of different subsets are configured to generate light source light having different spectral distributions. In such embodiments, a control system may be configured to control the plurality of light sources. In specific embodiments, the control system may control the subsets of light sources individually.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The system, or apparatus, or device may execute an action in a "mode" or "operation mode" or "mode of operation" or "control mode". Likewise, in a method an action or stage, or step may be executed in a "mode" or "operation mode" or "mode of operation" or "control mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

The phrase "arranged at the first support side" and similar phrases may especially refer to being arranged at the first domain side of one (or more) of the n1 domains.

In embodiments, one or more of the s1 light sources may be configured at the first domain side of one or more domains (of the n1 domains), especially wherein the one or more first domain sides of the one or more domains have optical properties in relation to the light source light.

In particular, it may be advantageous for the domain side of the domain on which a light source is arranged to be reflective for the light source light. Hence, in further embodiments, the one or more of the s1 light sources may be configured at the first domain side of one or more domains (of the n1 domains), especially wherein the one or more first domain sides of the one or more domains are reflective for the light source light. In further embodiments, one or more of the one or more first domain sides may be provided with a removable layer, wherein the removable layer has optical properties in relation to the light source light different from the one or more of these one or more first domain sides (of the one or more domains). For example, the domain, especially the first domain side, may be transmissive for the light source light, but the first domain side may be covered by a removable layer that is reflective for the light source light. Alternatively or additionally, one or more of the one or more second domain sides may be provided with a removable layer, wherein the removable layer has optical properties in relation to the light source light different from the one or more of these one or more first domain sides (of the one or more domains). This may be useful in embodiments, wherein e.g. due to folding a second domain side may be directed to the light source and/or when for instance the domain may be transparent or translucent for the light source light. Therefore, the use of the removable layer is not limited to the first domain side(s).

The removable layer may be a counter layer to an adhesive layer, which may stick to the adhesive layer and may be removed thereof. Hence, in embodiments an optical foil may be removable and may stick to the substrate, due to an adhesive layer on at least part of the substrate. In alternative embodiments, the removable layer maybe an adhesive layer. In specific embodiments, an adhesive layer may thus have a double function: with a removable layer having optical properties attached, it may simply hold the removable layer having optical properties, and with the removable layer having optical properties removed (but not the adhesive layer removed), it can be used to stick to another domain, or to a wall or ceiling.

In further embodiments, the optical properties may differ in one or more of: transmission percentage, transmission direction, wavelength dependence of the transmission, reflection percentage, reflection direction, wavelength dependence of the reflection, and percentage of specular reflection and/or percentage of diffuse reflection.

Hence, in embodiments, the removable layer and the (first) domain side the removable layer is arranged upon may differ in transmission percentage, especially wherein the transmission percentage of the removable layer is lower than the transmission percentage of the (first) domain side. In further embodiments, the removable layer and the (first) domain side the removable layer is arranged upon may differ in transmission direction. In further embodiments, the removable layer and the (first) domain side the removable layer is arranged upon may differ in wavelength dependence of the transmission, especially the removable layer and the (first) domain side each selectively transmit one or more wavelengths of the light source light. In further embodiments, the removable layer and the (first) domain side the removable layer is arranged upon may differ in reflection percentage, especially wherein the reflection percentage of the removable layer is higher than the reflection percentage of the (first) domain side. In further embodiments, the removable layer and the (first) domain side the removable layer is arranged upon may differ in reflection direction. In further embodiments, the removable layer and the (first) domain side the removable layer is arranged upon may differ in wavelength dependence of the reflection, especially the removable layer and the (first) domain side each selectively reflect one or more wavelengths of the light source light. In further embodiments, the removable layer and the (first) domain side the removable layer is arranged upon may differ in percentage of specular reflection. In further embodiments, the removable layer and the (first) domain side the removable layer is arranged upon may differ in percentage of diffuse reflection. In yet further embodiments, the removable layer and the (first) domain side the removable layer is arranged upon may differ in percentage of specular transmission and percentage of diffuse transmission.

Note that the above embodiments, wherein possible differences between the removable layer and the (first) domain side the removable layer is arranged upon are described, may thus also apply to possible differences between the removable layer and the second domain side the removable layer may in embodiments be arranged upon.

With such removable layer, it may also be possible to control a main direction of the light source light, as this may differ between the removable layer and the domain to which it adheres. Alternatively or additionally, it may also be possible to control a distribution of directions of the light source light, as this may differ between the removable layer and the domain to which it adheres.

Further, in embodiments, the optical properties of a domain may vary over its length and/or width. Likewise, in case of a removable layer, the optical properties of the adhesive layer may vary over its length and/or width. Hence, in specific embodiments optical properties of the domain or adhering foil may be non-uniform. In embodiments, the optical properties may have a pattern, such as in specific embodiments aligned with the LED positions.

Thereby, the removable (adhesive) layer may provide additional flexibility with regards to the final employment of the light generating device.

In embodiments, the removable (adhesive) layer may especially be reflective, such as diffusely reflective, or such as specularly reflective.

Herein, when an element is indicated to be transmissive this may in embodiments imply that at one or more wavelengths the part of the radiation that is transmitted may be larger than the part of the radiation that is reflected or absorbed. Herein, when an element is indicated to be reflective this may in embodiments imply that at one or more wavelengths the part of the radiation that is reflected may be larger than the part of the radiation that is transmitted or absorbed.

The term "transmissive" with regards to the light source light may herein refer to at least 50% of incident light source light passing through the material, such as at least 60%, especially at least 70%, such as at least 80%, especially at least 90%, such as at least 95%, under perpendicular irradiation. Similarly, the term "reflective" with regards to the light source light may herein refer to at least 50% of incident light source light being reflected, such as at least 60%, especially at least 70%, such as at least 80%, especially at least 90%, such as at least 95%, under perpendicular irradiation. Here, the percentages may refer to percentages based on Watts.

In embodiments, at least two, even more especially at least three, of the n1 domains may have individually selected domain widths W2 and domain lengths L2, especially wherein for each of the at least three of the n1 domains applies that $L2 \geq 2*W2$. In further embodiments, the at least three of the n1 domains may have the same domain lengths L2, but may have individually selected widths W2. Hence, the widths of two or more of the domains (that are configured parallel) may be the same or may differ. Especially, the length of the domains (that are configured parallel) may essentially be the same.

In further embodiments, the at least three of the n1 domains may be elongated along the domain length L2, especially wherein $W2 \leq L2$, especially $W2 \leq 0.8*L2$, such as $W2 \leq 0.6*L2$, especially $W2 \leq 0.5*L2$, such as $W2 \leq 0.3*L2$. Such values may e.g. especially apply to sheets. For strips, the values may in specific embodiments e.g. be $W2 \leq L2$, especially $W2 \leq 0.1*L2$, such as $W2 \leq 0.05*L2$, especially $W2 \leq 0.01*L2$, such as $W2 \leq 0.005*L2$.

In further embodiments, the s1 light sources may be configured in one or more arrays, especially wherein the arrays are selected from the group of 1D arrays and 2D arrays. For instance, two or more domains may each comprise an array of light sources. Two or more arrays may also (in embodiments) form a (super) array.

The term "array" may herein especially refer to an ordered arrangement, especially a repeating arrangement. Therefore, an array may be defined by e.g. one or two pitches.

Hence, a 1D array may especially refer to an arrangement along a line, especially parallel to a fold line, wherein the distances between the light sources follow a regular pattern. In particular, the light sources may be equidistantly arranged along the line. However, in embodiments, the light sources may also be arranged according to a pattern defined by two alternating distances, such as L-L---L-L---L-L---L-L, wherein "L" is a light source and "-" is a unit of distance.

Similarly, a 2D array may especially refer to an arrangement along a grid in two dimensions, wherein distances between the light sources in each of the two dimensions follows a regular pattern.

In embodiments, a single domain and/or a plurality of serially arranged domains are configured rolled up thereby providing a roll. In particular, the light generating device may be arranged as a roll. For application, part of the roll may be unrolled, and may be used, or the entire roll may be used. Hence, in specific embodiments the light support may also be dividable in different parts, wherein each part may comply with one or more of the embodiments of the light generating device as defined herein. Therefore, in embodiments, the light generating device may be elongated along the support length, especially wherein the light generating device comprises repeating length sections along the support length. In particular, in such embodiments, the light generating device may be rolled up along the support length. The roll may then be (at least partially) rolled out and (at least part of) one or more repeating length sections may be cut from the roll, especially providing two light generating devices; one still (partially) rolled up, and one cut from the roll.

In embodiments, the light generating device may be folded. In particular, the light generating device may be folded after having been unrolled from the roll or cut from the roll.

In further embodiments, the light generating device may comprise repeating width sections along the support width. The repeating width sections may enable folding of the light generating device into a repeating structure.

In embodiments, the at least three of the n1 domains may comprise a first domain, a second domain, and a third domain, especially wherein the first domain and the third domain are both adjacent to the second domain. In further embodiments, the first domain and the third domain may each individually have a mutual angle α with the second domain, wherein the mutual angles α are unequal to 180°. In particular, the first domain and the second domain may be separated by a (first) fold line, and the third domain and the second domain may be separated by a (second) fold line, wherein the light generating device is bent at both fold lines to provide angle α unequal to 180°. In embodiments, the angles α between the second domain and the first and third domains may be the same. However, in further embodiments, the angles α between the second domain and the first and third domains may differ. Hence, different mutual angles between different sets of domains may be individually selected.

In further embodiments, each mutual angle α may be individually selected such that $0° \leq α < 180°$, wherein $α=0°$ may correspond to the adjacent domains being completely folded on top of each other, and wherein $α=180°$ may correspond to the adjacent domains being arranged on a straight line, i.e., they are essentially unbent. In further embodiments, each mutual angle α may be individually selected such that $α<180°$, especially $α \leq 150°$, such as $α \leq 135°$, especially $α \leq 115°$, such as $α \leq 90°$, especially $α \leq 60°$, such as $α \leq 45°$, especially $α \leq 30°$, such as $\leq 15$, especially $\leq 10°$, such as $\leq 5°$, especially $\leq 3°$, such as $\leq 1°$, including 0°. In further embodiments, each mutual angle α may be individually selected such that $α \geq 0°$, especially $α \geq 5°$, such as $α \geq 10°$, especially $α \geq 30°$, such as $α \geq 45°$, especially $α \geq 60°$, such as $α \geq 90°$, especially $α \geq 115°$, such as $α \geq 135°$.

In specific embodiments, for instance when a domain is transmissive, such as a domain forming part of a cavity, the angle may also be smaller than 90°. For instance, a cavity may be provided by three domains defining an enclosing triangle with mutual angles of 60°. In other embodiments, for instance when a domain is absorbing, any angle may be used, e.g. to create a desired beam cut-off. Hence, also angles smaller than 90° may be applied, but also angles larger than 90° may be applied.

In particular, each mutual angle α may be defined as the angle between the domain sides of the adjacent domains at the support side at which the fold line, especially the groove, is arranged. Hence, in embodiments, the mutual angle α between a first set of two domains may be defined between the first domain sides of the domains of the first set of two domains, whereas the mutual angle α between a second set of two domains may be defined between the second domain sides of the two domains of the second set of two domains.

The folding may provide rigidity to the light generating device. The rigidity may be further enhanced when the light generating device comprises multiple adhesive layers arranged at different domain sides and/or domains to facilitate fixation of the folds at desired angles.

The rigidity may also be further enhanced by (essentially) folding domains on top of one another, which may thereby provide a (locally) thicker enclosing for the light generating device. Hence, in embodiments, two adjacent domains may have mutual angles α selected from the range of $0 \leq \alpha \leq 5°$.

Providing domains close to each other, like stacking may thus provide a reinforced structure. However, such embodiments may also have optical effects, as e.g. transmission, scattering, and/or absorption may be controlled.

In further embodiments, one or more of the first domain, the second domain, the third domain, and optionally one or more further domains, may be configured to beam shape the light source light. In particular, in such embodiments, the mutual angles α may each be individually selected from the range of at least 90° and smaller than 180°.

The s1 light sources may especially be arranged on the second domain. Hence, in further embodiments, one or more of the s1 light sources may be supported by the second domain, especially wherein the first domain and the third domain do not support one or more of the s1 light sources. Hence, in embodiments, each of the s1 light sources may be supported by the second domain. In particular, the first domain and the third domain may be devoid of light sources.

With the light sources on the second domain, the first and third domain may especially contribute to the optical properties of the light generating device. Hence, in further embodiments, the first domain and the third domain may be reflective or transmissive for the light source light, especially (at least partly) reflective, or especially (at least partly) transmissive. In particular, the first domain and the third domain may (i) both be reflective, (ii) both be transmissive, and (iii) both be partly reflective and partly transmissive In further embodiments, two or more, especially three or more, of the first domain, the second domain, the third domain, and optionally one or more further domains, may enclose the one or more of the s1 light sources. The one or more of the s1 light sources may thus be walled in by two or more of the domains. Thereby, the one or more of the s1 light sources may not be directly visible, and the optical properties of the light generating device in each direction may be defined by the domains.

In general, in further embodiments, at least one of the first domain, the second domain, the third domain, and the optionally one or more further domains, may be transmissive for the light source light.

In particular, in embodiments a subset of the first domain, the second domain, the third domain, and optionally one or more further domains may enclose the one or more of the s1 light sources, and at least one domain of the subset may be transmissive for the light source light.

In embodiments, three or more domains together form a structure having a triangular, square, rectangular, pentagonal, hexagonal, heptagonal, octagonal, or other cross-sectional shape. Hence, one or more light sources may be configured in a cavity defined by a plurality of domains, wherein the cavity has a cross-sectional shape selected from a triangular, square, rectangular, pentagonal, hexagonal, heptagonal, octagonal, or other cross-sectional shape. In embodiments, three or more domains together may form a structure having a regular polygonal shape (i.e. all angles the same, and optionally equal side lengths). However, different angles and/or side lengths may also be possible. In specific embodiments, the sides may be straight or bent, thereby creating other shapes like in embodiments an eye-shape (two bent sides connected by two corners), or a half-ellipse (one curved and one straight side), or other combinations of straight and bent sides, etc.

In embodiments, the cavity may be provided by two curved domains, which are connected by two fold lines.

Hence, domains may in embodiments also be curved, such as around an axis of elongation.

In specific embodiments, the invention also provides a light generating device comprising s1 light sources and a support configured to support the s1 light sources, wherein the s1 light sources are configured to generate light source light, wherein $s1 \geq 1$; and wherein:

(a) the support comprises n1 domains, wherein $n1 \geq 2$, wherein the support comprises k1 fold lines, wherein $k1 \geq 1$, wherein at least three of the n1 domains are separated by at least two of the k1 fold lines; wherein the domains have a first domain side and a second domain side, wherein the first domain side and the second domain side define a support thickness (H1); (b) the at least three of the n1 domains and the at least two of the k1 fold lines are configured parallel; and (c) the light generating device comprises m1 adhesive layers, wherein $m1 \geq 1$; and wherein at least two of the m1 adhesive layers are functionally coupled to one or more of (i) different domain sides of one or more domains, and (ii) different domains.

In yet a further aspect, the invention provides a method comprising providing the lighting devices as a roll, unrolling at least part thereof to provide the light generating device defined by that at least part in an (essentially) unrolled state, folding at least two domains, and applying the light generating device to a support, such as a wall or ceiling or device, etc. The method may further optionally comprise removing optional protective layers from adhesive layers. Such protective layers may be used to prevent undesired adhesion (before application of the adhesive layer to a support). Further, the method may optionally comprise removing a removable layer having optical properties. As can be derived from the above, the removable layer may in embodiments be an adhesive layer.

Further, note that the roll may provide a single light generating device. However, in embodiments the roll may provide a plurality of light generating devices. In embodiments, the light generating device may be configured such, that it may be cut into two or more light generating devices.

In a further aspect, the invention may provide a lighting device, especially a lighting device selected from the group comprising a lamp, a luminaire, a projector device, a disinfection device, and an optical wireless communication device, comprising the light generating device according to the invention.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3A-E schematically depict embodiments of the light generating device after folding.

DETAILED DESCRIPTION OF THE EMBODIMENTS

Figure 1A:
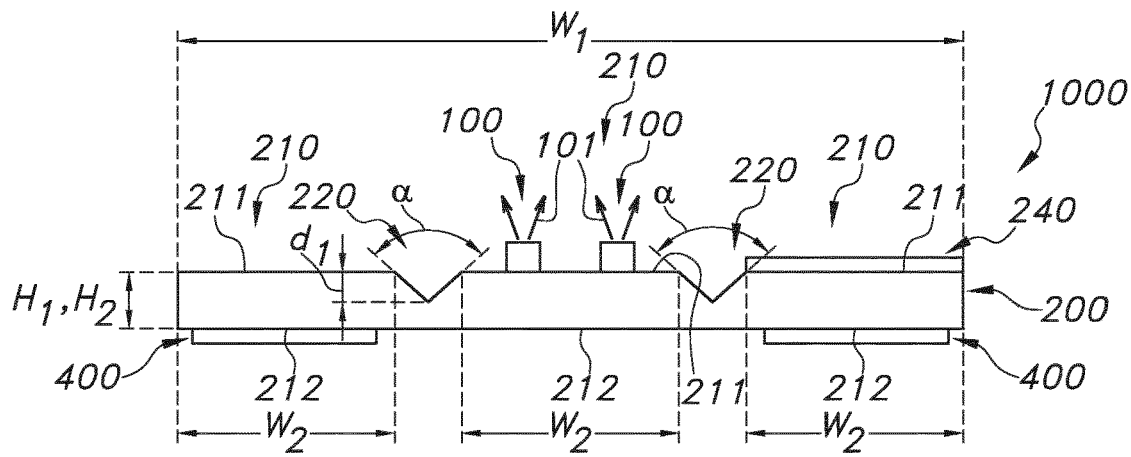
FIG. 1 A-D schematically depict embodiments of the light generating device.

FIG. 1A schematically depicts a side view of an embodiment of the light generating device 1000. The light generating device 1000 comprises s1 light sources 100, wherein the s1 light sources 100 are configured to generate light source light 101, wherein $s1 \geq 1$, such as $s1 \geq 2$. The light generating device 1000 further comprises a support 200 configured to support the s1 light sources 100. The support 200 comprises n1 domains 210, wherein $n1 \geq 3$. The support 200 further comprises k1 fold lines 220, wherein $k1 \geq 2$. In particular, at least three of the n1 domains 210 may be separated by at least two of the k1 fold lines 220 (also see FIG. 1B). In the depicted embodiment, the at least three of the n1 domains 210 and the at least two of the k1 fold lines 220 may be configured parallel. Further, the domains 210 may have a first domain side 211 and a second domain side 212, wherein the first domain side 211 and the second domain side 212 define a support thickness H1. The first domain side 211 and the second domain side 212 may further define a domain thickness H2, which may (locally) equal the support thickness H1.

In general, the domain thicknesses H2 of different domains may be (essentially) equal. In particular, the (average) domain thicknesses H2 of different domains may vary by less than 5%. Note, however, that on the domains in different domains and/or at different parts of the domains different layers or items may be available.

In embodiments, the support may comprise part of a (flexible) PCB. In other embodiments, a PCB may be functionally coupled, such as mechanically coupled to the support. The support may be a base foil, such as a PI foil or PET foil on which a PCB or a plurality of PCBs may be provided. Other support materials may be e.g. PET, PMMA, or PC, or optical foils comprising one or more other materials. On such foil, a (flexible) PCB may be laminated. Also more than one PCB may be supported by the foil.

In the depicted embodiment, the light generating device 1000 comprises m1 adhesive layers 400, wherein $m1 \geq 2$. In embodiments, at least two of the m1 adhesive layers 400 may be functionally coupled to one or more of (i) different domain sides 211,212 of one or more domains 210, and (ii) different domains 210. In the depicted embodiment, the at least two of the m1 adhesive layers 400 are functionally coupled to different domains 210.

In particular, in the depicted embodiment, $s1=2$, $n1=3$, $k1=2$, and $m1=2$.

In the depicted embodiment, one or more of the s1 light sources 100 may be configured at the first domain side 211 of one or more domains 210 (of the n1 domains 210).

In further embodiments, one or more first domain sides 211 of the one or more domains may be reflective for the light source light 101.

However, in further embodiments, the domains 210, especially the first domain sides 211, may be transmissive for the light source light 101, but a removable (adhesive) layer 240 may be arranged on one or more first domain sides 211 of the n1 domains 210, wherein the removable (adhesive) layer 240 is reflective for the light source light 101. Thereby, the optical properties of the light generating device 1000 can be easily tuned by (partially) removing the adhesive layer 240.

The adhesive layer 240 may further provide other optical properties, i.e., the removable (adhesive) layer 240 may have optical properties in relation to the light source light 101 that differ from the optical properties of the domains 210, especially of the first domain sides 211, in relation to the light source light 101. In particular, in embodiments, one or more of the s1 light sources 100 may be configured at the first domain side 211 of one or more domains 210 (of the n1 domains 210), wherein the one or more first domain sides 211 of the one or more domains have optical properties in relation to the light source light 101, wherein one or more of these one or more first domain sides 211 are provided with a removable (adhesive) layer 240, and wherein the removable (adhesive) layer 240 has optical properties in relation to the light source light 101 different from the one or more of these one or more first domain sides 211 (of the one or more domains 210).

In further embodiments, the optical properties of the removable (adhesive) layer 240 and the one or more domains 210 of the n1 domains 210, especially the first domain sides 211 of the one or more domains 210, may differ in one or more of transmission percentage, transmission direction, wavelength dependence of the transmission, reflection percentage, reflection direction, wavelength dependence of the reflection, and especially percentage of specular reflection and/or percentage of diffuse reflection.

In the depicted embodiment, the fold lines 220 comprise a groove, especially wherein the groove is configured to facilitate folding. In particular, the groove has a V-shape. In embodiments, the groove may have a groove depth d1, especially wherein $0.1*H1 \leq d1 \leq 0.9*H1$.

Figure 1B:
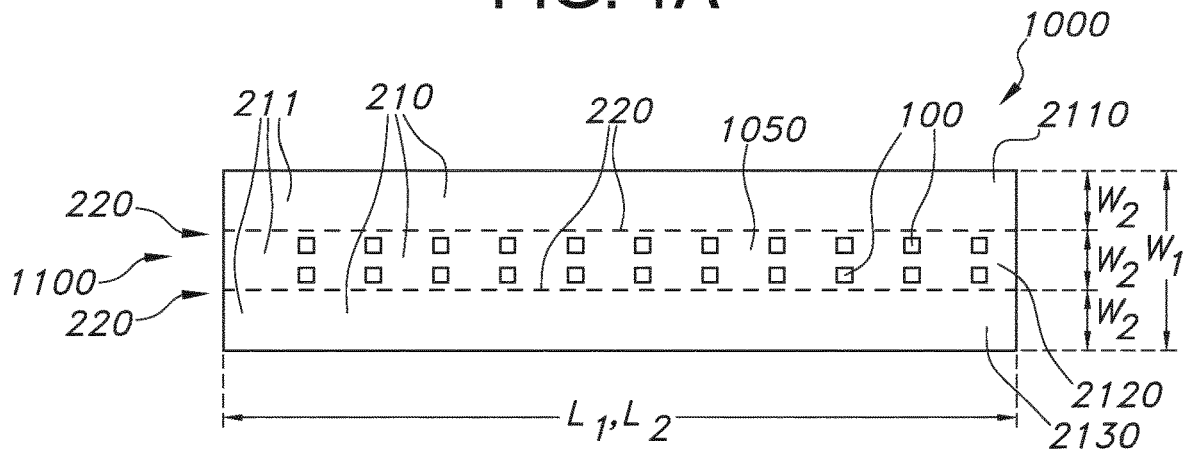

FIG. 1B schematically depicts a top view of the embodiment of FIG. 1A. In particular, in the depicted embodiment, the n1 domains 210 have an axis of elongation along the support length L1, i.e., the domain length L2 may be larger than the domain width L2, especially wherein $L2 \geq 2*W2$, such as $\geq 3*W2$, especially $\geq 5*W2$. Further, in the depicted embodiment, the domain length L2 may be equal to the support length L1, i.e., in the depicted embodiment all fold lines 220 are arranged parallel to the support length L1.

In the depicted embodiment, the domains 210 have a rectangular shape, wherein the domain length L2 and the domain width W2 are parallel to the support length L1 and the support width W2 respectively. Hence, the domain length L2 of the at least three of the n1 domains 210 and the at least two of the k1 fold lines 220 is configured parallel. In particular, the axis of elongation of the domains 210 is configured parallel to the k1 fold lines 220.

In particular, in the depicted embodiment, at least three of the n1 domains 210 have individually selected domain widths W2, and have domain lengths L2, wherein for each of the at least three of the n1 domains 210 applies that $L2 \geq 2*W2$.

FIG. 1B further schematically depicts that the s1 light sources are arranged on a second domain 2120, which is configured between a first domain 2110 and a third domain 2130, according to a regular pattern. In particular, the s1 light sources 100 are configured in one or more arrays 1100, wherein the arrays 1100 are selected from the group of 1D arrays and 2D arrays. Specifically, in the depicted embodiment, the s1 light sources 100 are arranged in a 2D array with two rows (along the support width W1) and a constant distance between the light sources 100 along the support length L1.

Reference 1050 indicates a PCB. Here, the PCB includes two rows of light sources 100. The PCB may at least partly be comprised by the middle domain 210 or may be configured on the middle domain 210. For instance, a PCB may be generated on a support (foil), which support (foil) may be much larger than necessary for the PCB, and which support (foil) can be used as support in the present invention.

Figure 1C:
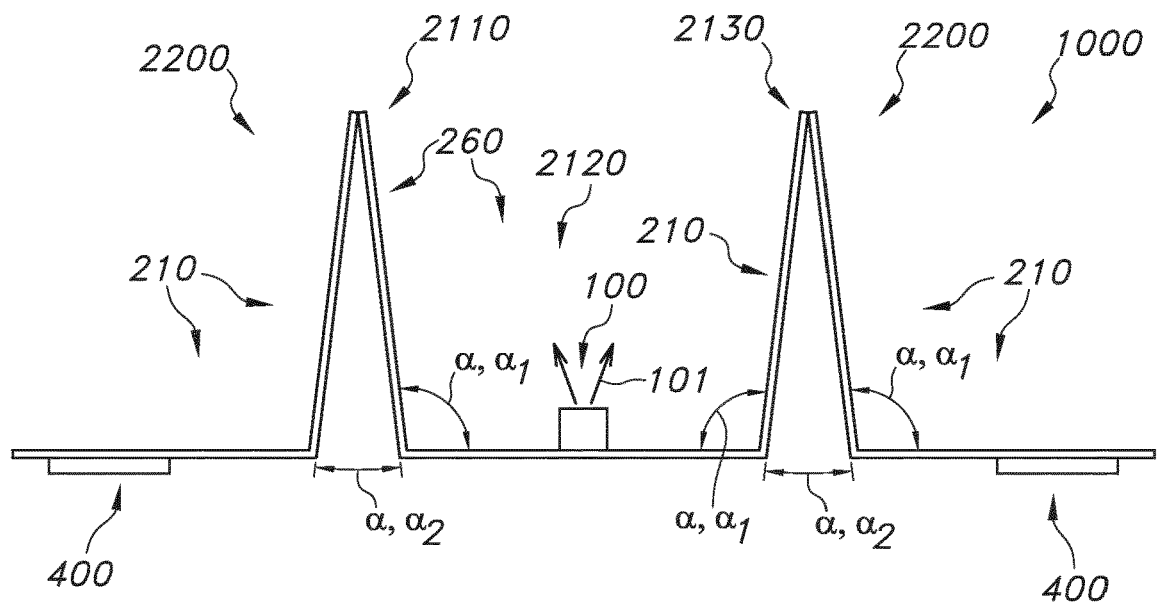

In particular, the light generating device 1000 may have repeating length sections along the support length L1, i.e., the light generating device 1000 may consist of a plurality of (essentially) identical repeating length sections arranged along the support length L1. This may be particularly convenient when the light generating device 1000 is arranged on a roll 1005, as it facilitates predictably cutting off light generating devices 1000 from the roll, especially cutting off identical light generating devices 1000 from the roll 1005. FIG. 1C schematically depicts an embodiment of the light generating device 1000 after folding along the fold lines 220. In particular, in the depicted embodiment, the at least three of the n1 domains 210 comprise a first domain 2110, a second domain 2120, and a third domain 2130, wherein the first domain 2110 and the third domain 2130 are both adjacent to the second domain 2120, and wherein the first domain 2110 and the third domain 2130 each individually have a mutual angle α with the second domain 2120, wherein the mutual angles α are unequal to 180°, especially ≤180°. In particular, in the depicted embodiment, the mutual angles α, $\alpha_1$ between the second domain 2120 and either of the first domain 2110 and the third domain 2130 may be about 100°. In further embodiments, the mutual angles α between the second domain 2120 and the first domain 2110 and between the second domain 2120 and the third domain 2130 may also differ.

In the depicted embodiment, each of the first domain 2110 and the third domain 2130 also have a mutual angle α with (respective) further domains, wherein the mutual angles α are unequal to 180°, especially <180°. In particular, for both the first domain 2110 and the third domain 2130 the mutual angle α, $\alpha_2$ with the further domain may be ≤5°. Hence, in embodiments, the light generating device 100 may comprise one or more sets 2200 of each two or more domains 210, wherein two adjacent domains 210 have mutual angles α selected from the range of 0≤α≤5°.

The s1 light sources 100 may be selectively arranged on one or more of the domains 210, particularly in consideration of any planned folds along the fold lines 220. Hence, in the embodiments depicted in FIG. 1A-C, the one or more of the s1 light sources 100 are supported by the second domain 2120, wherein the first domain 2110 and the third domain 2130 do not support one or more of the s1 light sources 100, i.e., all s1 light sources are arranged on the second domain 2120, wherein the first domain 2110 and the third domain 2130 are devoid of s1 light sources.

In further embodiments, the first domain 2110, the second domain 2120 and the third domain 2130 may be reflective or transmissive for the light source light 101. In particular, the first domain 2110 and the third domain 2130 may be reflective or transmissive for the light source light 101.

Figure 1D:
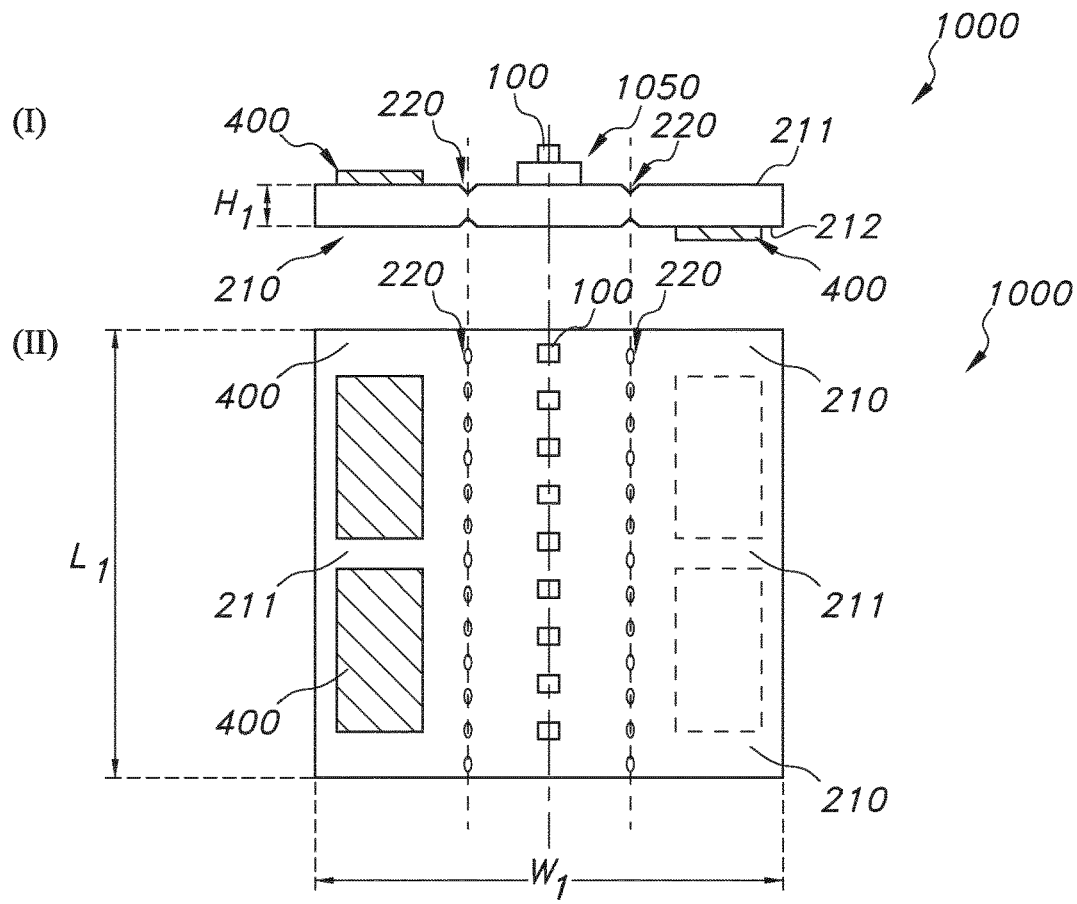

FIG. 1D schematically depict two embodiments, one in cross-sectional view, indicated with embodiment I and one in cross-sectional view, indicated with embodiment II. Both embodiments shows some optional features. Examples of fold lines 220 as indentation or as perforation, are shown in embodiments I and II, respectively. In embodiment I, an adhesive layer 400 is shown at the first side 211 and an adhesive layer 400 is shown at the second side 212. In embodiment II, two adhesive layers 400 or two parts of an adhesive layer 400 are schematically depicted. Note that in embodiment II the PCB 1050 has a smaller width than the respective domain 210.

Figure 2:
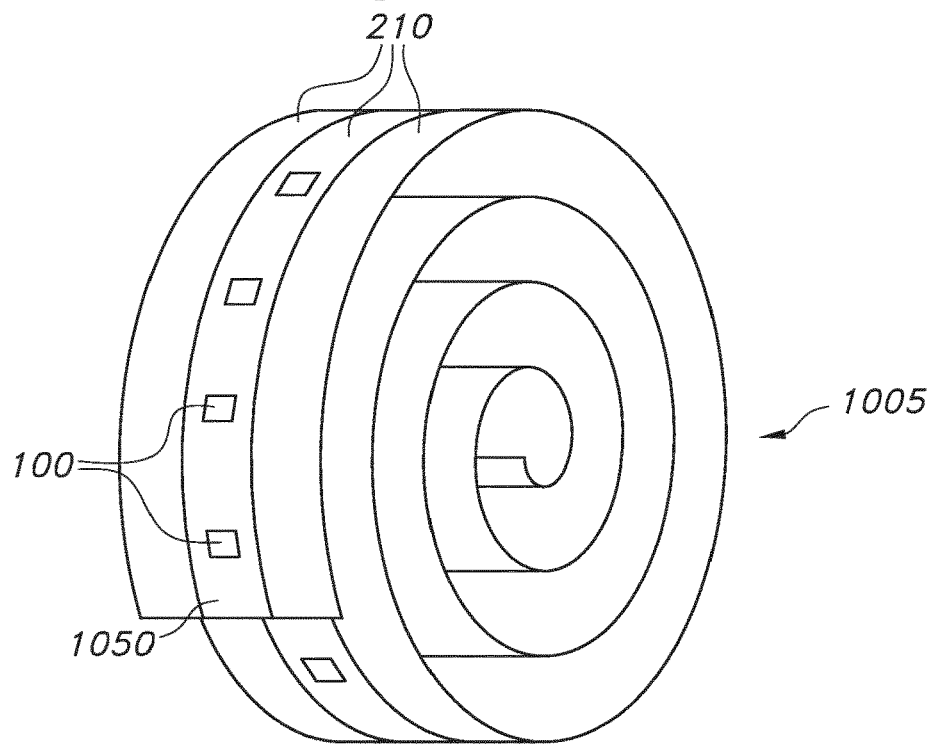
FIG. 2 schematically depicts an embodiment of the light generating device configured as a roll.

FIG. 2 schematically depicts an embodiment of the light generating device 1000 wherein a single domain 210 and/or a plurality of serially arranged domains 210 are configured rolled up thereby providing a roll 1005. Hence, in embodiments, the support 200 may be bendable, especially flexible.

In particular, the light generating device 1000 may be configured as a roll 1005. Thereby, the light generating device 1000 may be compactly stored and easily transported, and parts of desired lengths can be easily cut off from the roll 1005 in order to install the light generating device 1000 at a desired location.

It will be clear to the person skilled in the art, that the nature of the repeating structure of the light generating device 1000 on the roll implies that a part can be cut off from the roll to yield two light generating devices 1000 according to the invention.

Figure 3A:
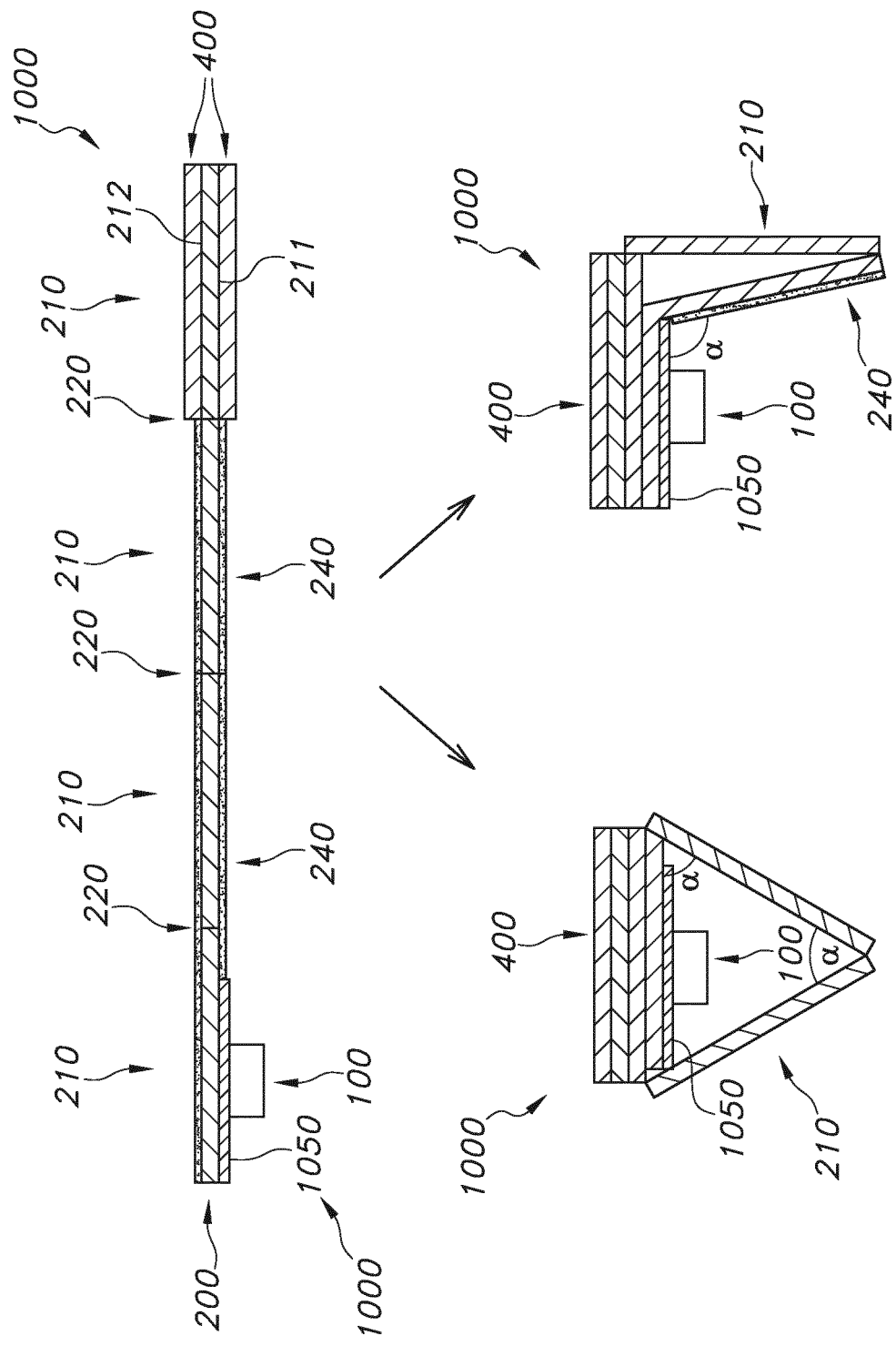
Figure 3B:
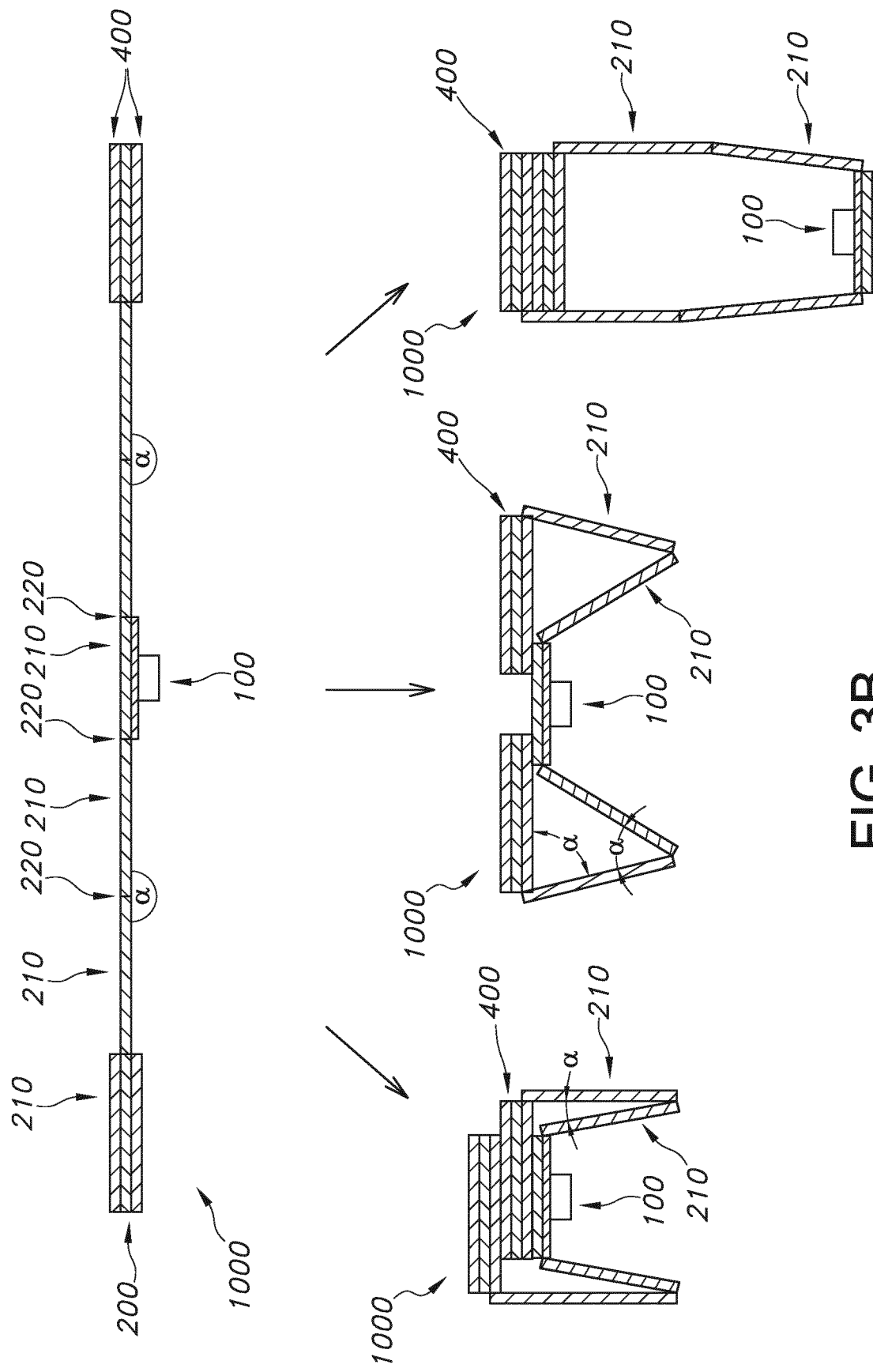
Figure 3D:
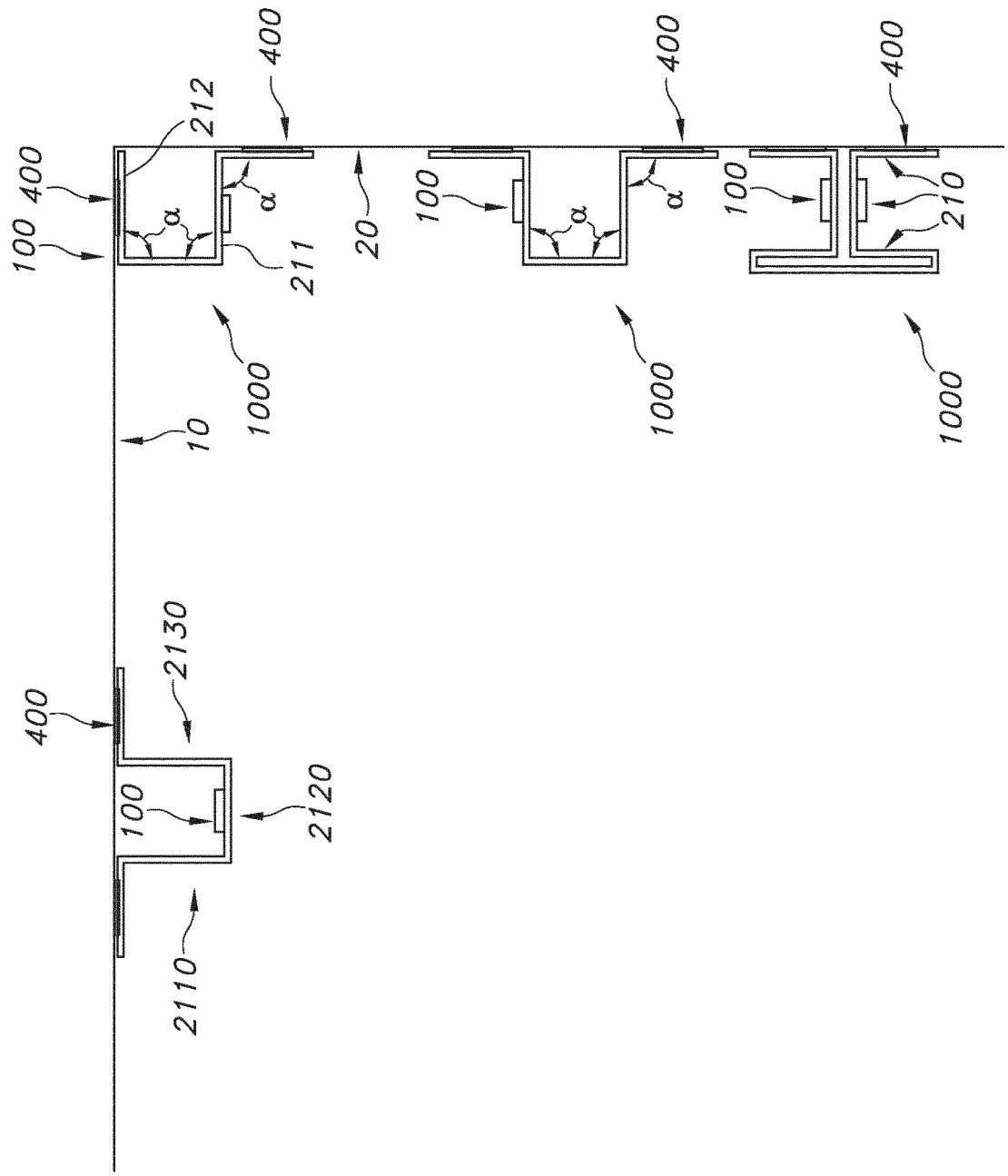

FIG. 3A-C schematically depict unfolded light generating devices 1000 as well as folded light generating devices 1000, they may be folded into. FIG. 3D schematically depicts further folded light generating devices 1000 arranged on a ceiling 10 or a wall 20.

FIG. 3A specifically depicts a light generating device 1000 with two adhesive layers 400 arranged on opposite domain sides 211 of a single domain 210, i.e., the light generating device 1000 comprises a domain 210 with a first domain side 211 and a second domain side 212, wherein the first domain side 211 and the second domain side define a domain thickness H2, and wherein two adhesive layers are arranged on the first domain side and the second domain side 212.

Hence, FIG. 3A schematically depicts at least one domain 210 with one of the m1 adhesive layers 400 functionally coupled to the first domain side 211 and with another one of the m1 adhesive layers 400 functionally coupled to the second domain side 212.

In the depicted embodiment, the light generating device 1000 further comprises a removable (adhesive) layer 240, which may have optical properties that differ from the underlying domains 210, especially from the underlying domain sides 212.

Hence, an adhesive layer 240 arranged on a first domain side 211 may have different optical properties than the (respective) first domain side 211, whereas an adhesive layer 240 arranged on a second domain side 212 may have different optical properties than the (respective) second domain side 212.

FIG. 3A further schematically depicts two embodiments of folded light generating devices 1000 that the unfolded light generating device 1000 of FIG. 3A may be folded into. Here adhesive layers 400 are provided both on the first side 211 and the second side 212 of a single domain 210.

In particular, in a first embodiment of the folded light generating device 1000 (left side), the domains 210 may be configured to enclose the light source 100, especially shielding the light source 100 from outside view, whereas the light source 100 may be exposed in the second embodiment of the folded light generating device 1000 (right side). Further, in the depicted embodiments the adhesive layers may have been selectively removed. For example, the adhesive layers 240 may be reflective for the light source light 101, and may thus be selectively removed (or maintained) to provide desired optical characteristics.

FIG. 3B further schematically depicts an embodiment of a light generating device 1000 with adhesive layers 400 arranged on opposite domain first sides 211 and second sides 212 of a plurality of domains 210. FIG. 3B further schematically depicts several embodiments of a folded light generating device 1000 the unfolded light generating device 1000 may be folded into.

Hence, a single arrangement of the unfolded light generating device 1000, especially on a roll 1005, may provide flexibility with regards to the folded light generating devices 1000 that can ultimately be installed at a given location.

Referring to some of the shapes shown in FIG. 3B, one or more of the first domain 2110, the second domain 2120, the third domain 2130, and optionally one or more further domains 210, are configured to beam shape the light source light 101. As schematically depicted, the mutual angles α of some of the domains are each individually selected from the range of at least 90° and smaller than 180°. Note that other angles α may have different values.

FIG. 3C schematically depicts an embodiment of the light generating device 1000 comprising comprise repeating width sections 1500 along the support width W1. For visualization purposes, only about 1.5 of the repeating width section 1500 is depicted for the unfolded light generating device 1000. The repeating width sections 1500 may enable folding of the light generating device 1000 into a repeating structure, as depicted in the lower half of FIG. 3C. It will be clear to the skilled person, that also many other configurations may be possible.

In the depicted embodiment, several domains 210 may be folded atop one another. Such configurations may provide enhanced rigidity (or strength) of the structure. Hence, in embodiments, the light generating device 100 may comprise one or more sets 2200 of each two or more domains 210, wherein two adjacent domains 210 have mutual angles α selected from the range of 0≤α≤5°, especially ≤α≤3°, such as α≤1°, including α=0°. In the depicted embodiments, the s1 light sources 100 are arranged at the first domain side 211 of the domains 210. However, in further embodiments, at least a first part of the s1 light sources 100 may be arranged at the first domain side 211 of the domains 210, and at least a second part of the s1 light sources 100 may be arranged at the second domain side 212 of the domains 210.

FIG. 3D schematically depicts several further embodiments of the folded light generating device 1000, wherein the light generating device 1000 is attached to a ceiling 10 and/or a wall 20 by the adhesive layer 400. In some configurations said adhesive layer 400 is provided only on the first side 211 of the domains 210, in another configuration, i.e. wherein the lighting device 1000 is mounted in the corner between the ceiling 10 and the wall 20, the adhesive layer 400 is provided on both the first side 211 and the second side 212 of different domains 210.

Further, FIG. 3D schematically depicts embodiments wherein two or more, especially three or more, of the first domain 2110, the second domain 2120, the third domain 2130, and optionally one or more further domains 210, enclose the one or more of the s1 light sources 100. In further embodiments, at least one of the first domain 2110, the second domain 2120, the third domain 2130, and the optionally one or more further domains 210, may be transmissive for the light source light 101.

Hence, in embodiments, at least one of the n1 domains 210 may be transmissive for the light source light 101.

Figure 3E:
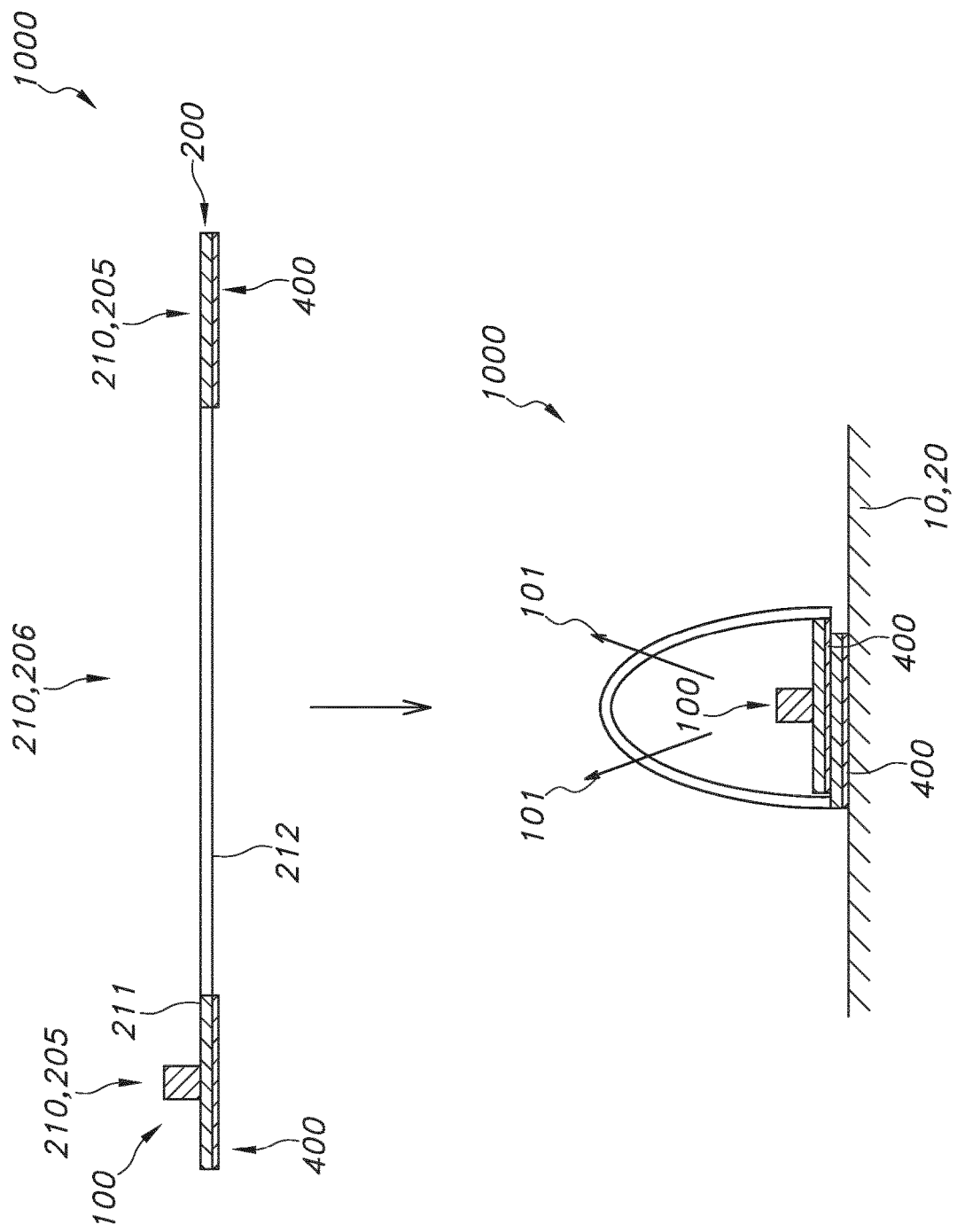

FIG. 3E schematically depicts a further embodiment, wherein the unfolded and folded state are shown in the upper and lower part of the drawing, respectively. Here, the support may comprise three domains 210, wherein the left domain 210 of the support is 200 is reflective or comprises a reflective layer. This reflective domain 210 or domain 210 provided with reflective layer is indicated with reference 205. Also at another end of the support 200 such reflective domain 210 or domain 210 provided with reflective layer is available. The middle domain 210 comprises a support 200 that is transmissive for light source light 101. AN embodiment of a folded state is shown in the lower part of the drawing, wherein the adhesive layers 400 are used to keep the domains in this folded state and provide a device 1000 with a cavity wherein the light source 100 is configured. Reference 206 may refer to a (diffuse) transmissive layer (part). Hence, here an example is shown with a support with a domain that is reflective or comprise a reflective layer, and a domain that is (diffuse) transmissive. For attaining the diffuse transmission of a domain, at least one of the first domain side 211 and second domain side 212 or bulk material of said domain may be provided with a diffusive feature, like coating, embedded scattering particles, sandblasted or frosted surface structures.

Figure 4:
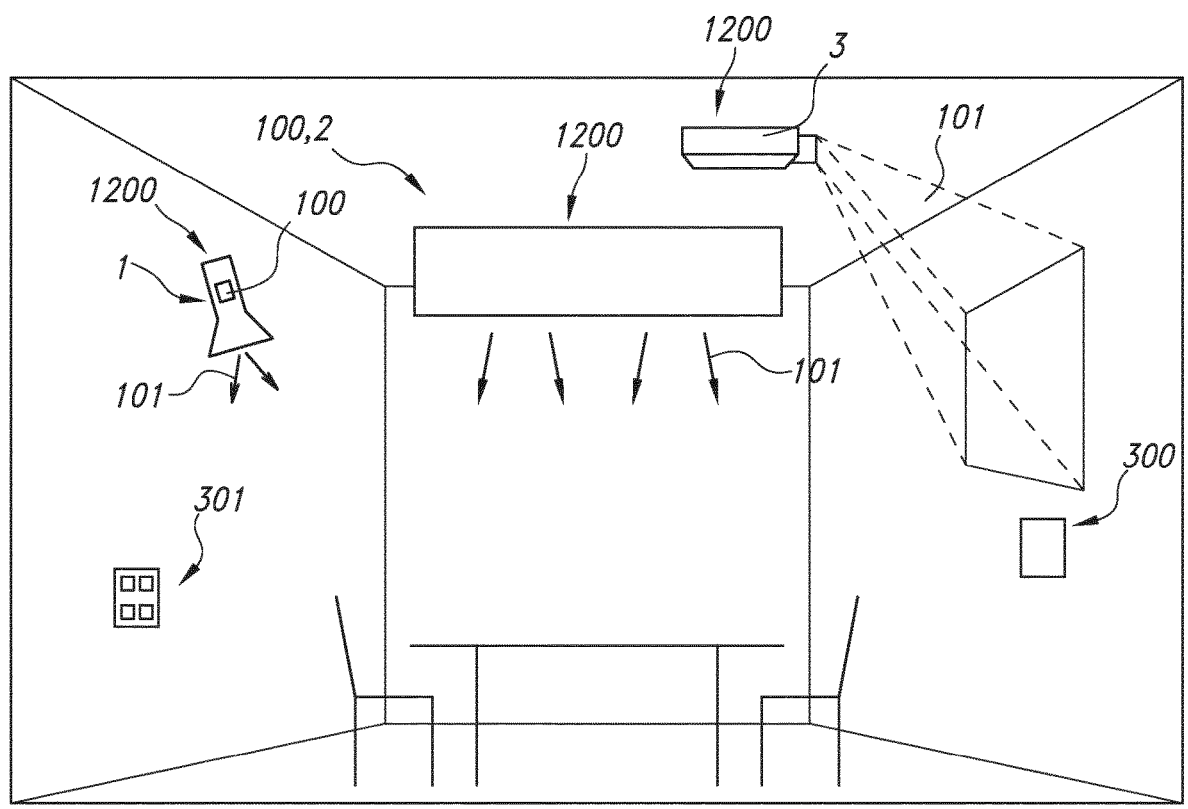
FIG. 4 schematically depicts embodiments of the lighting device. The schematic drawings are not necessarily on scale.

FIG. 4 schematically depicts an embodiment of a lighting device 1200. In particular, the lighting device 1200 may be selected from the group of a lamp 1, a luminaire 2, a projector device 3, a disinfection device, and an optical wireless communication device. The lighting device 1200 may especially comprise the light generating device 1000 according to the invention. Specifically, FIG. 4 schematically depicts a luminaire 2 comprising the light generating device 1000. Reference 301 indicates a user interface which may be functionally coupled with a control system 300 comprised by or functionally coupled to the light generating system 1000. FIG. 4 also schematically depicts an embodiment of a lamp 1 comprising the light generating device 1000. Reference 3 indicates a projector device or projector system, which may be used to project images, such as at a wall, which may also comprise the light generating device 1000.

The term "plurality" refers to two or more. Furthermore, the terms "a plurality of" and "a number of" may be used interchangeably.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%. Moreover, the terms "about" and "approximately" may also relate to 90% or higher, such as 95% or higher, especially 99% or higher, even more especially 99.5% or higher, including 100%. For numerical values it is to be understood that the terms "substantially", "essentially", "about", and "approximately" may also relate to the range of 90%-110%, such as 95%-105%, especially 99%-101% of the values(s) it refers to.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

The term "further embodiment" and similar terms may refer to an embodiment comprising the features of the previously discussed embodiment, but may also refer to an alternative embodiment.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", "include", "including", "contain", "containing" and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings. Moreover, if a method or an embodiment of the method is described being executed in a device, apparatus, or system, it will be understood that the device, apparatus, or system is suitable for or configured for (executing) the method or the embodiment of the method, respectively.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising s1 light sources and a support configured to support the s1 light sources, wherein the s1 light sources are configured to generate light source light, wherein s1≥1; and wherein:
   the support comprises n1 domains, wherein n1 is more than three, wherein the support comprises k1 fold lines, wherein the fold lines define the domains, at least three of the n1 domains are separated by at least two of the k1 fold lines; wherein the domains have a first domain sided and a second domain side;
   the n1 domains and the k1 fold lines are configured parallel to each other; and
   the light generating device comprises m1 adhesive layers, wherein m1≥2;
   wherein at least two of the m1 adhesive layers are functionally coupled to different domain sides of one or more domains;
   wherein a plurality of domains are configured to define a cavity in that at least one domain can be folded atop another domain to form said cavity; and
   wherein said domains folded atop one another can mutually be fixed by the adhesive layer as provided on one domain side, and the light generating device can be adhered to a further element by the adhesive layer as provided on the other, opposite domain side.

2. The light generating device according to claim 1, wherein the support is flexible.

3. The light generating device according to claim 1, wherein the s1 light sources comprise solid state light sources; wherein the support comprises a PCB or wherein a PCB is functionally coupled to the support, and wherein the s1 light sources are functionally coupled to the PCB.

4. The light generating device according to claim 1, wherein at least one of the n1 domains is transmissive for the light source light.

5. The light generating device according to claim 1, wherein one or more of the s1 light sources are configured at the first domain side of one or more domains, and wherein the one or more first domain sides of the one or more domains are reflective for the light source light.

6. The light generating device according to claim 1, wherein one or more domains have optical properties in relation to the light source light, wherein of these one or more domains one or more of the first domain sides and the second domain sides are provided with a removable layer, wherein the removable layer has optical properties in relation to the light source light different from the one or more domains.

7. The light generating device according claim 6, wherein the optical properties differ in one or more of: transmission percentage, transmission direction, wavelength dependence of the transmission, percentage of specular transmission, percentage of diffuse transmission, reflection percentage, reflection direction, wavelength dependence of the reflection, percentage of specular reflection, and percentage of diffuse reflection.

8. The light generating device according to claim 6, wherein at least three of the n1 domains have individually selected domain widths (W2), and have domain lengths (L2), wherein for each of the at least three of the n1 domains applies that $L2 \geq 2*W2$, and wherein the s1 light sources are configured in one or more arrays, wherein the arrays are selected from the group of 1D arrays and 2D arrays.

9. The light generating device according to claim 6, wherein the at least three of the n1 domains comprise a first domain, a second domain, and a third domain, wherein the first domain and the third domain are both adjacent to the second domain, wherein one or more of the first domain and the third domain individually have a mutual angle $\alpha$ with the second domain, wherein the mutual angles $\alpha$ are unequal to 180°.

10. The light generating device according to claim 9, wherein one or more of the s1 light sources are supported by the second domain, wherein the first domain and the third domain do not support one or more of the s1 light sources, wherein the first domain and the third domain are reflective or transmissive for the light source light.

11. The light generating device according to claim 9, wherein three or more of the first domain, the second domain, the third domain, and optionally one or more further domains, enclose the one or more of the s1 light sources, and wherein at least one of the first domain, the second domain, the third domain, and the optionally one or more further domains, are transmissive for the light source light.

12. The light generating device according to claim 9, comprising one or more sets of each two or more domains, wherein two adjacent domains have mutual angles $\alpha$ selected from the range of $0 \leq \alpha \leq 5°$.

13. The light generating device according to claim 9, wherein at least one fold between adjacent domains is provided with the groove on the first domain side, and at least one further fold is provided with a further groove on the second domain side.

14. The light generating device according to claim 9, comprising at least one domain with one of the m1 adhesive layers functionally coupled to the first domain side and with another one of the m1 adhesive layers functionally coupled to the second domain side.

15. A lighting device selected from the group of a lamp, a luminaire, a projector device, a disinfection device, and an optical wireless communication device, comprising the light generating device according to claim 9.

\* \* \* \* \*